United States Patent
Sato et al.

(10) Patent No.: US 11,063,588 B1
(45) Date of Patent: Jul. 13, 2021

(54) RESET DEVICE, CIRCUIT DEVICE, AND RESETTING METHOD

(71) Applicant: ALPS ALPINE CO., LTD., Tokyo (JP)

(72) Inventors: Hiroki Sato, Miyagi (JP); Tomoyuki Sawataishi, Miyagi (JP); Akira Shoji, Miyagi (JP); Takehiko Kan, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/106,533

(22) Filed: Nov. 30, 2020

(30) Foreign Application Priority Data

Dec. 25, 2019 (JP) .............................. JP2019-234247

(51) Int. Cl.
    *H03K 17/22* (2006.01)
(52) U.S. Cl.
    CPC .................................. *H03K 17/223* (2013.01)
(58) Field of Classification Search
    None
    See application file for complete search history.

(56) References Cited

U.S. PATENT DOCUMENTS 8,564,323 B2 * 10/2013 Waser .................. H03K 17/223
                                                     324/762.01
2013/0313904 A1   11/2013 Kayama

FOREIGN PATENT DOCUMENTS

JP          2013-246679        12/2013

* cited by examiner

*Primary Examiner* — Jeffery S Zweizig
(74) *Attorney, Agent, or Firm* — IPUSA, PLLC

(57) ABSTRACT

A reset device includes a power-on reset (POR) circuit configured to output a reset signal to reset a circuit part to an initial state when supply voltage is lower than a threshold level, a first switch provided in a path connecting a first line to supply the supply voltage to the circuit part and a second line to supply the supply voltage to the POR circuit, a second switch provided in a path connecting a signal line of the circuit part and the second line, and a control circuit configured to turn on the first switch and turn off the second switch in a normal mode, and to turn off the first switch and turn on the second switch in a test mode. The control circuit turns on the first switch and turns off the second switch in response to the reset signal being output from the POR circuit.

10 Claims, 7 Drawing Sheets

RESET DEVICE, CIRCUIT DEVICE, AND RESETTING METHOD

CROSS-REFERENCE TO RELATED APPLICATION

This application is based upon and claims priority to Japanese patent application No. 2019-234247, filed on Dec. 25, 2019, the entire contents of which are incorporated herein by reference.

BACKGROUND OF THE INVENTION

1. Field of the Invention

The present invention relates to a reset device that resets a circuit part to a predetermined initial state, a method of such resetting, and a circuit device including the reset device.

2. Description of the Related Art

The state of the circuit part of a common semiconductor integrated circuit (IC) including a flip-flop becomes undefined immediately after the power is turned on. Therefore, the circuit part has to be reset to a predetermined initial state with a certain reset signal. The undefined state of the circuit part is not allowed, for example, when the circuit part includes a writable memory such as a flash read-only memory (ROM), when the circuit part has a forbidden combination of signal values, or when the initial state of an interface is specified.

The external supply of a reset signal may be promised, but in general, a power-on reset (POR) circuit is provided in the semiconductor IC, assuming that there is no external supply of a reset signal.

FIG. 1A illustrates a configuration of a common semiconductor IC including a POR circuit 110. At the time of turning on power when a supply voltage Vdd rises from zero, the POR circuit 110 outputs a low-level reset signal Sr to a circuit part 100. Normally, the POR circuit 110 continues outputting the low-level reset signal Sr to the circuit part 100 for a while even after the supply voltage Vdd rises to a voltage that enables the circuit part 100 to operate normally. This ensures that the circuit part 100 is in a predetermined initial state and can prevent the circuit part 100 from being in an undefined state. See, for example, U.S. Pat. App. Pub. No. 2013/0313904A1.

SUMMARY OF THE INVENTION

According to an aspect of the present invention, a reset device configured to reset a circuit part to an initial state at a time of turning on power includes a power-on reset (POR) circuit, a first switch, a second switch, and a control circuit. The POR circuit is configured to output a reset signal to reset the circuit part to the initial state when supply voltage is lower than a threshold level, and to stop outputting the reset signal in response to the supply voltage rising and exceeding the threshold level. The first switch is provided in a path connecting a first power supply line to supply the supply voltage to the circuit part and a second power supply line to supply the supply voltage to the POR circuit. The second switch is provided in a path connecting a signal line to transmit a signal of the circuit part and the second power supply line. The control circuit is configured to turn on the first switch and turn off the second switch in a normal mode where the supply voltage is supplied from the first power supply line to the POR circuit, and to turn off the first switch and turn on the second switch in a test mode where the supply voltage is supplied from the signal line to the POR circuit. The control circuit is configured to turn on the first switch and turn off the second switch in response to the reset signal being output from the POR circuit.

DETAILED DESCRIPTION OF THE PREFERRED EMBODIMENTS

As a technique for diagnosing the failure of a semiconductor IC such as a complementary metal-oxide-semiconductor (CMOS), it is known to measure quiescent supply current (IDDQ) that flows through the power supply of a quiescent semiconductor IC whose internal logic state does not change. In the case of trying to measure quiescent supply current flowing through the circuit part of a semiconductor IC from outside the semiconductor IC, however, it is difficult to accurately measure only the quiescent supply current of the circuit part because externally measured supply current includes current flowing to a POR circuit.

Figure 1A:
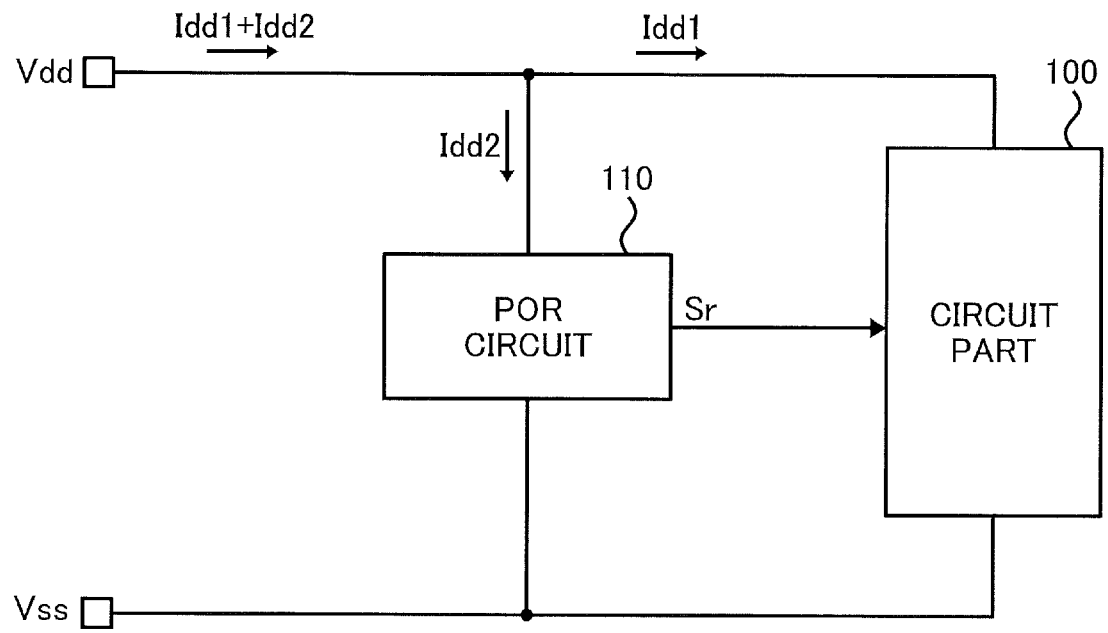
FIGS. 1A and 1B are diagrams illustrating common circuit devices including a POR circuit.

Referring to FIG. 1A, supply current measurable from outside the semiconductor IC is the sum of supply current Idd1 flowing to the circuit part 100 and supply current Idd2 flowing to the POR circuit 110 (Idd1+Idd2). Even if the circuit part 100 is put into a quiescent state to measure its quiescent supply current, the quiescent supply current of the circuit part 100 cannot be properly evaluated from this measurement result because the supply current measured from outside the semiconductor IC includes the supply current Idd2 of the POR circuit 110.

Figure 1B:
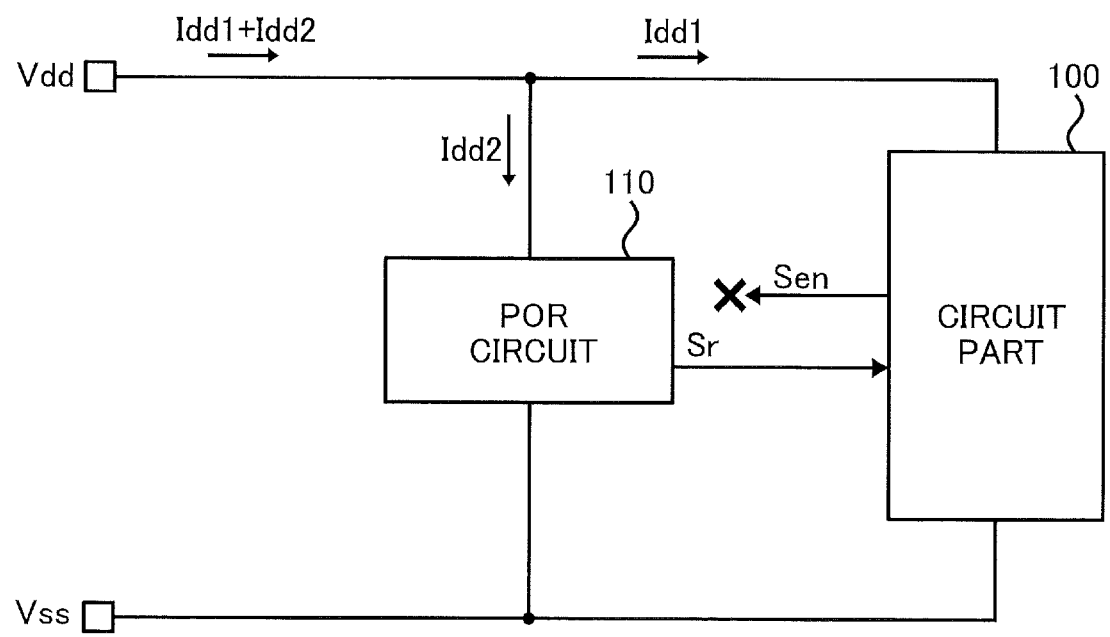

As illustrated in FIG. 1B, an enabling signal Sen that controls the operating state of the POR circuit 110 may be output from the circuit part 100, and when measuring the quiescent supply current, the enabling signal Sen may cause the POR circuit 110 to stop operating. According to this method, however, the enabling signal Sen is undefined before the circuit part 100 is reset to an initial state by the POR circuit 110. Therefore, the enabling signal Sen that is undefined when the power is turned on prevents the POR circuit 110 from operating normally, thus causing a problem in that the circuit part 100 is not reset to an initial state.

Figure 2A:
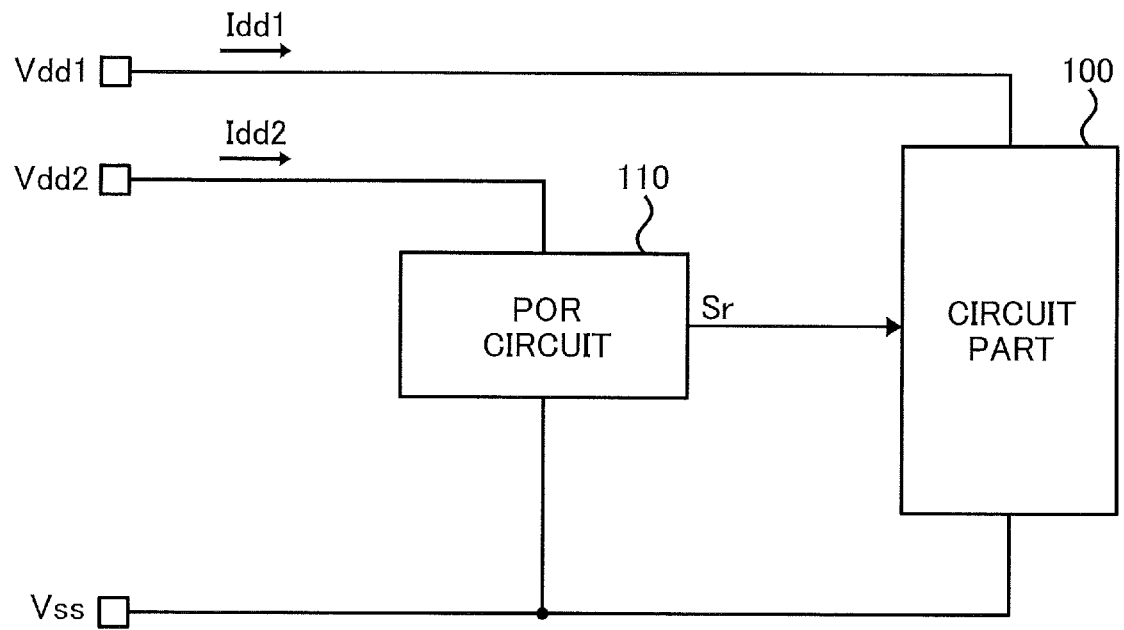
FIGS. 2A and 2B are diagrams illustrating configurations for preventing supply current to the POR circuit from flowing through the power supply line of a circuit part in order to measure quiescent supply current.

As a method of avoiding the effect of the supply current Idd2 of the POR circuit 110, a path for supplying supply voltage Vdd1 to the circuit part 100 and a path for supplying supply voltage Vdd2 to the POR circuit 110 may be provided independent of each other as illustrated in FIG. 2A.

Figure 2B:
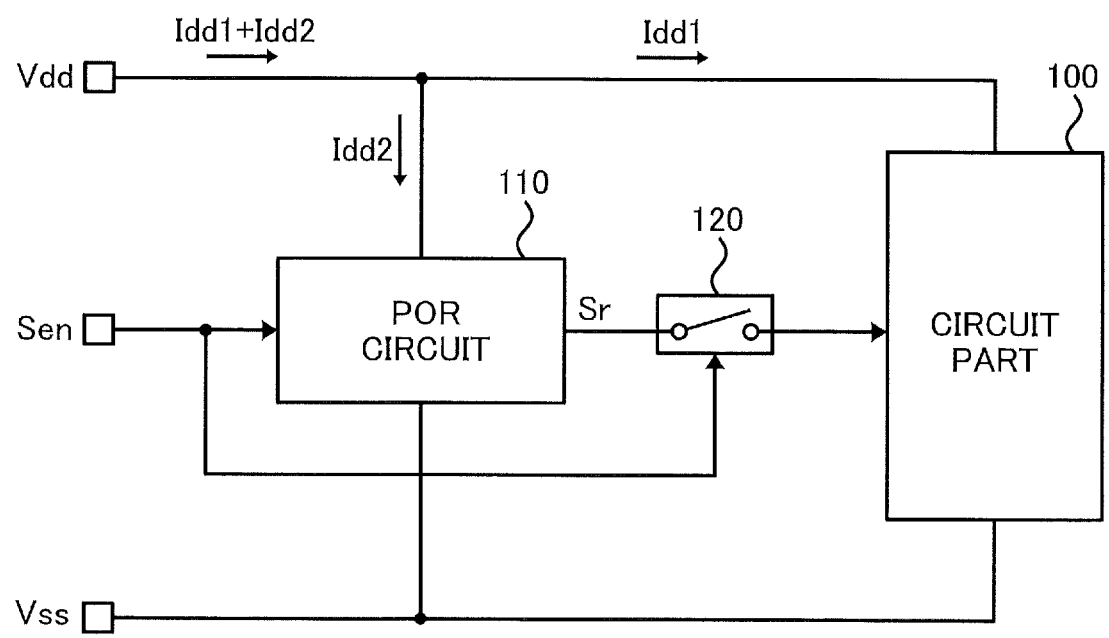

Furthermore, as a different method, the enabling signal Sen may be input to the POR circuit 110 from outside the semiconductor IC as illustrated in FIG. 2B. In FIG. 2B, a switch 120, which is for preventing the circuit part 100 from being reset by the reset signal Sr when the POR circuit 110 is caused to stop operating by the enabling signal Sen, interrupts a path for inputting the reset signal Sr to the circuit part 100 in response to the enabling signal Sen.

The methods illustrated in FIGS. 2A and 2B, however, have the disadvantage that a terminal dedicated to measuring the quiescent supply current of the circuit part 100 which is not used in normal operation has to be provided. According to the configuration illustrated in FIG. 2A, the same supply voltage as applied to the circuit part 100 has to be constantly applied to the terminal of the POR circuit 110 dedicated to the supply voltage Vdd2. According to the configuration illustrated in FIG. 2B, a fixed voltage (a voltage to enable the POR circuit 110 to operate) has to be constantly applied to the terminal of the POR circuit 110 dedicated to the enabling signal Sen.

When it is necessary to minimize the number of terminals, such as when there are functional limitations or cost constraints on semiconductor ICs, it is difficult to provide a dedicated terminal that is not used in normal operation as described above, and the method as illustrated in FIG. 2A or 2B cannot be employed.

According to an aspect of the present invention, a reset device that can prevent supply current to a POR circuit from flowing through the power supply line of a circuit part without providing a dedicated terminal, its resetting method, and a circuit device including such a reset device are provided.

First Embodiment

Figure 3:
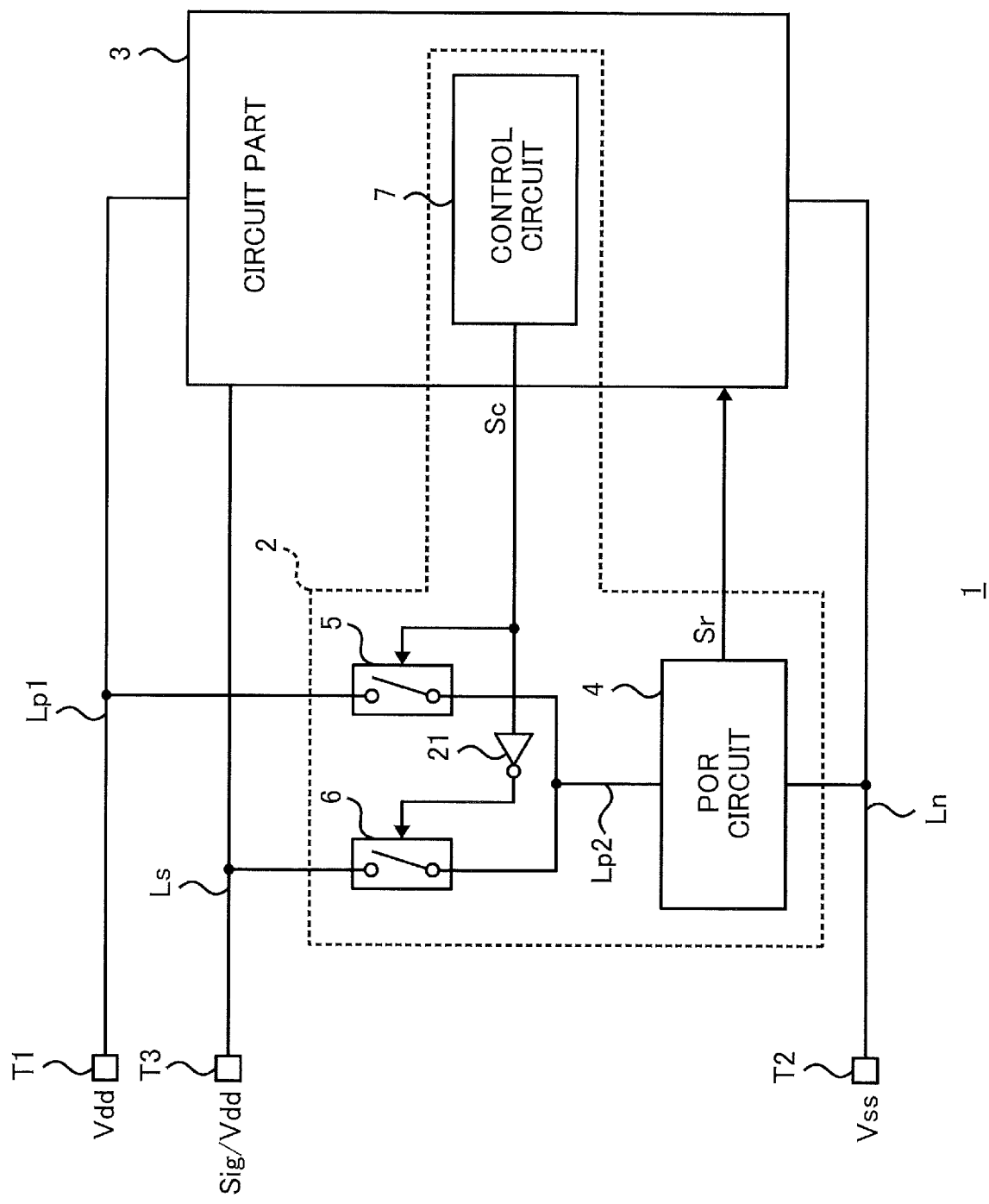
FIG. 3 is a diagram illustrating a configuration of a circuit device according to a first embodiment.

FIG. 3 is a diagram illustrating a configuration of a circuit device 1 according to a first embodiment.

The circuit device 1 includes a circuit part 3 including a predetermined circuit, and a reset device 2 that resets the circuit part 3 to an initial state when the power is turned on. The reset device 2 includes a POR circuit 4, a first switch 5, a second switch 6, and a control circuit 7. The control circuit 7, however, is included in the circuit part 3. As an example, the reset device 2 and the circuit part 3 are formed on a single semiconductor substrate.

The circuit part 3 is supplied with supply voltage via a first power supply line Lp1 and a power supply line Ln to operate. The first power supply line Lp1 is connected to a terminal T1 to which the positive potential of the supply voltage is to be applied. The power supply line Ln is connected to a terminal T2 to which the negative potential (ground potential) of the supply voltage is to be applied.

The circuit part 3 resets the internal circuit state (such as signal values held by flip-flops) to a predetermined initial state in response to the reset signal Sr output from the POR circuit 4.

The POR circuit 4 is supplied with the supply voltage via a second power supply line Lp2 and the power supply line Ln to operate. The positive potential of the supply voltage is applied to the second power supply line Lp2 via the first switch 5 or the second switch 6.

The POR circuit 4 outputs the reset signal Sr to reset the circuit part 3 to the initial state when the supply voltage is lower than a predetermined threshold level Vth, and stops outputting the reset signal Sr when the supply voltage rises and exceeds the threshold level Vth. For example, the POR circuit 4 stops outputting the reset signal Sr after passage of a certain time since the supply voltage rises and exceeds the threshold level Vth.

The POR circuit 4 outputs, for example, a low-level signal (near zero volts) as the reset signal Sr to reset the circuit part 3 to the initial state. That is, the POR circuit 4 holds the reset signal Sr low when the supply voltage is lower than the predetermined threshold level Vth. When the supply voltage increases to exceed the threshold level Vth, the POR circuit 4 makes the reset signal Sr high. In this case, the circuit part 3 is in the initial state during the low-level period of the reset signal Sr, and can transition to any state other than the initial state when the reset signal Sr switches from low level to high level.

The first switch 5 is provided in a path connecting the first power supply line Lp1 and the second power supply line Lp2, and turns on or off in response to a switch control signal Sc of the control circuit 7. When the first switch 5 turns on, the second power supply line Lp2 is connected to the first power supply line Lp1, so that the supply voltage is supplied from the first power supply line Lp1 to the POR circuit 4.

The second switch 6 is provided in a path connecting a signal line Ls that transmits a signal Sig of the circuit part 3 and the second power supply line Lp2, and turns on or off in response to the switch control signal Sc of the control circuit 7. The signal line Ls is a signal path connecting a terminal T3 that connects to an external device and a signal input terminal or a signal output terminal (such as a tri-state output terminal) of the circuit part 3, and transmits the signal Sig between these terminals. When the second switch 6 turns on, the second power supply line Lp2 is connected to the signal line Ls, so that the supply voltage is supplied from the signal line Ls to the POR circuit 4.

According to the example of FIG. 3, the reset device 2 includes an inverter circuit 21 that inverts the switch control signal Sc. The second switch 6 turns on or off in response to the switch control signal Sc inverted by the inverter circuit 21.

The first switch 5 and the second switch 6 may be switches formed of semiconductor devices such as transistors, or mechanical switches such as relays.

The control circuit 7 is included in the circuit part 3, and is therefore set to an initial state when the POR circuit 4 outputs the reset signal Sr. In this initial state, the control circuit 7 outputs the switch control signal Sc that turns on the first switch 5 and turns off the second switch 6.

When the POR circuit 4 stops outputting the reset signal Sr, the control circuit 7 transitions to a normal mode to supply the supply voltage from the first power supply line Lp1 to the POR circuit 4 or to a test mode to supply the supply voltage from the signal line Ls to the POR circuit 4. For example, the control circuit 7 transitions to the normal mode or the test mode in response to a signal input to the terminal T3 or another terminal that is not depicted from an external device (a signal that sets an operating mode). In the normal mode, the control circuit 7 outputs the switch control signal Sc that turns on the first switch 5 and turns off the second switch 6. In the test mode, the control circuit 7 outputs the switch control signal Sc that turns off the first switch 5 and turns on the second switch 6.

Figure 4:
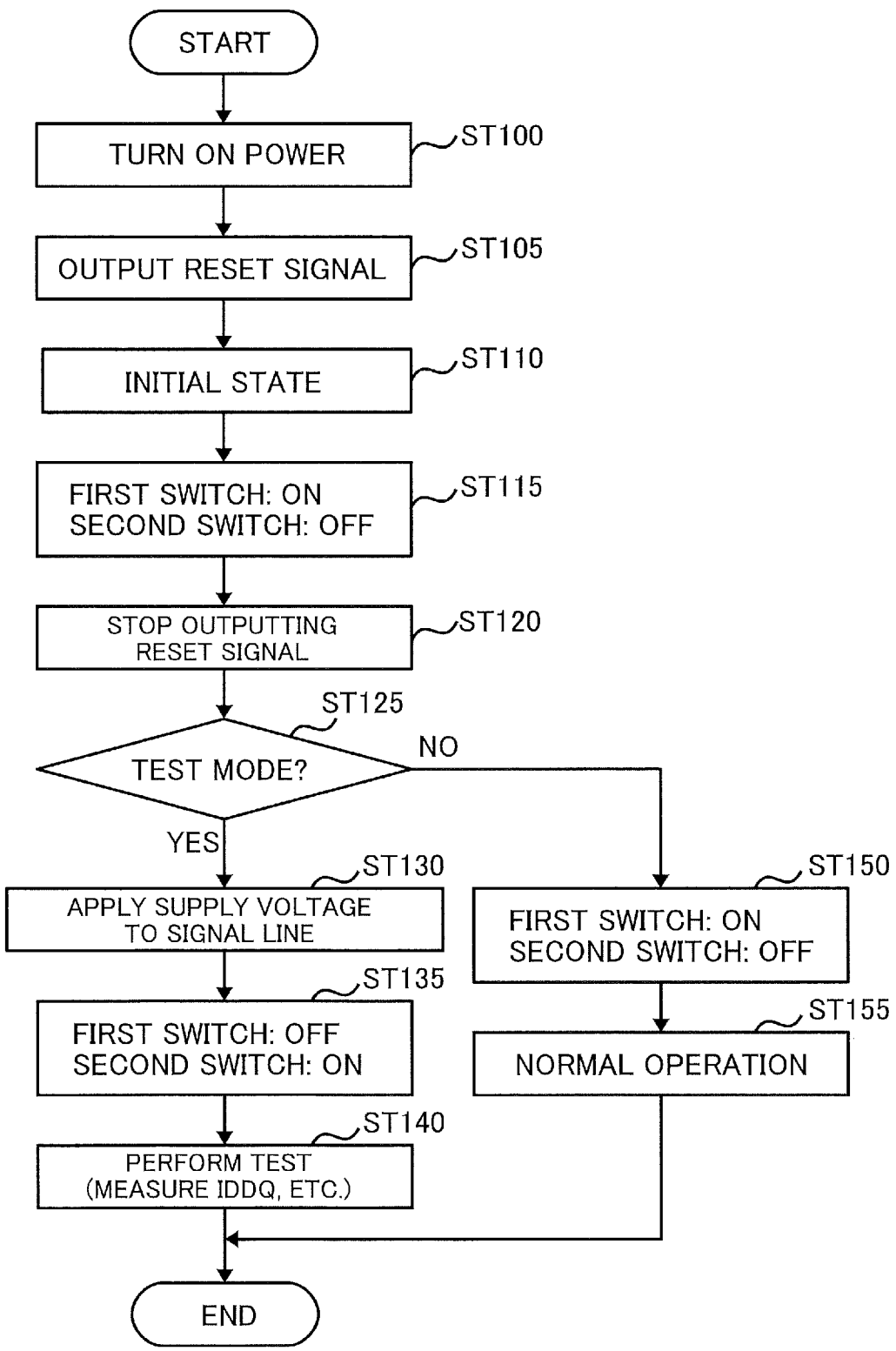
FIG. 4 is a flowchart for illustrating operation at the time of turning on power.

Next, the operation of the circuit device 1 having the above-described configuration when the power is turned on is described with reference to the flowchart of FIG. 4.

When the power of the circuit device 1 is turned on at step ST100, at step ST105, the POR circuit 4 outputs the reset signal Sr because the voltage of the first power supply line Lp1 is lower than the threshold level Vth. When the voltage of the first power supply line Lp1 reaches a voltage necessary for the operation of the circuit part 3, at step ST110, the control circuit 7 starts to operate to be reset to the initial state. When the control circuit 7 turns to the initial state, at step ST115, the switch control signal Sc of the control circuit 7 turns on the first switch 5 and turns off the second switch 6. As a result, the supply voltage is supplied from the first power supply line Lp1 to the POR circuit 4, so that the POR circuit 4 starts to operate. When the supply voltage supplied from the first power supply line Lp1 to the POR circuit 4 exceeds the threshold level Vth (for example, when a predetermined time passes since the supply voltage exceeds the threshold level Vth), at step ST120, the POR circuit 4 stops outputting the reset signal Sr. When the output of the reset signal Sr is stopped, the circuit part 3 (the control circuit 7) can transition to a state other than the initial state.

When the output of the reset signal Sr is stopped, at step ST125, it is determined whether the operating mode is the test mode. The control circuit 7 controls the first switch 5 and the second switch 6 in accordance with the operating mode.

When the operating mode is the normal mode (NO at step ST125), at step ST150, the switch control signal Sc of the control circuit 7 turns on the first switch 5 and turns off the second switch 6. That is, the on-off state of the first switch 5 and the second switch 6 set at step ST115 is maintained, and the supply voltage is supplied from the first power supply line Lp1 to the POR circuit 4. At step ST155, the circuit part 3 performs normal operation in this state. At this point, the signal line Ls is disconnected from the second power supply line Lp2 by the second switch 6, and therefore can transmit any signal Sig.

When the operating mode is the test mode (YES at step ST125), at step ST130, the same supply voltage as applied to the first power supply line Lp1 is applied to the signal line Ls connected to the terminal T3. In this state, at step ST135, the switch control signal Sc of the control circuit 7 turns off the first switch 5 and turns on the second switch 6. As a result, the supply voltage is supplied from the signal line Ls to the POR circuit 4. Supply current to the POR circuit 4 starts to flow through the signal line Ls and does not flow through the first power supply line Lp1. In the test mode, at step ST140, for example, quiescent supply current is measured, and supply current to the circuit part 3 flowing through the first power supply line Lp1 is measured. Because no supply current to the POR circuit 4 flows through the first power supply line Lp1, the quiescent supply current to the circuit part 3 alone can accurately be measured.

As described above, according to this embodiment, when the supply voltage is lower than the threshold level Vth at the time of turning on power, the POR circuit 4 outputs the reset signal Sr. Therefore, when the supply voltage rises to a voltage necessary for the operation of the circuit part 3, the circuit part 3 is reset to the initial state. When the circuit part 3 is reset to the initial state, the control circuit 7 performs such control as to turn on the first switch 5 and turn off the second switch 6, so that the supply voltage is supplied from the first power supply line Lp1 to the POR circuit 4. When the supply voltage exceeds the threshold level Vth while being supplied to the POR circuit 4, the POR circuit 4 stops outputting the reset signal Sr to enable the circuit part 3 to transition to a state other than the initial state.

In the normal mode, the control circuit 7 performs such control as to turn on the first switch 5 and turn off the second switch 6, so that the supply voltage is supplied from the first power supply line Lp1 to the POR circuit 4. As a result, the POR circuit 4 maintains a normal operating state (a state where the output of the reset signal Sr is stopped) to enable the circuit part 3 to perform normal-mode operation. Furthermore, because the signal line Ls is disconnected from the second power supply line Lp2, the signal Sig of the circuit part 3 transmitted through the signal line Ls is prevented from affecting the operation of the POR circuit 4. This allows a desired signal Sig to flow through the signal line Ls.

In the case of the test mode, with a voltage higher than the threshold level Vth (for example, the same supply voltage as applied to the first power supply line Lp1) being applied to the signal line Ls, the control circuit 7 performs such control as to turn off the first switch 5 and turn on the second switch 6. As a result, a voltage higher than the threshold level Vth is supplied to the POR circuit 4 as supply voltage. Therefore, the POR circuit 4 maintains a normal operating state (a state where the output of the reset signal Sr is stopped) to enable the circuit part 3 to perform test-mode operation.

Accordingly, the terminal T3 used to supply the supply voltage to the POR circuit 4 in the test mode can also be used to input or output the signal Sig of the circuit part 3 in the normal mode. That is, it is possible to prevent supply current to the POR circuit 4 from flowing through the first power supply line Lp1 of the circuit part 3 in the test mode without providing a dedicated terminal used in only the test mode.

Furthermore, according to this embodiment, the control circuit 7 is included in the circuit part 3. Therefore, part of the circuit part 3 can also be used for the control circuit 7, so that the overall configuration of the circuit device 1 can be simplified.

Second Embodiment

Figure 5:
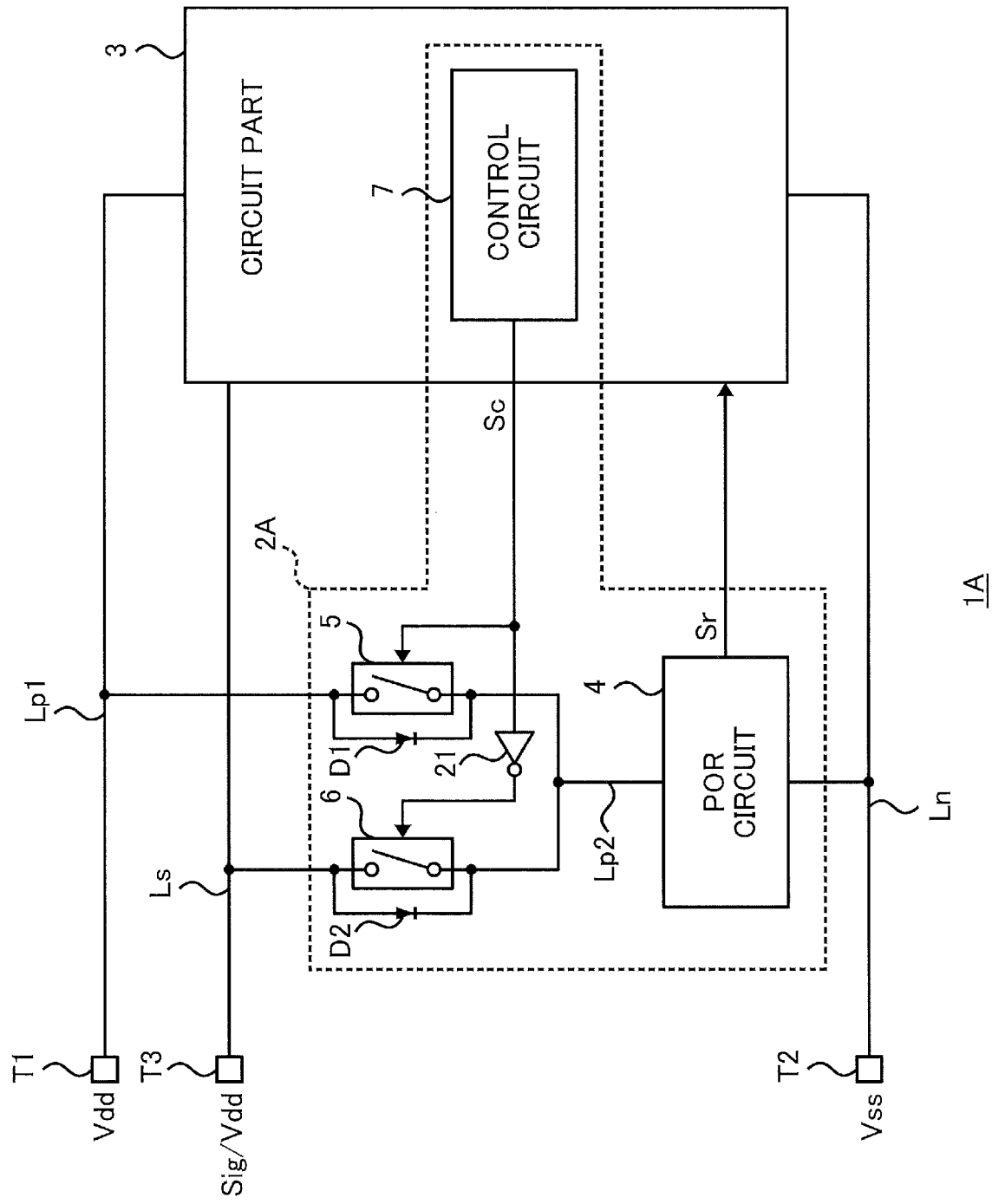
FIG. 5 is a diagram illustrating a configuration of a circuit device according to a second embodiment.

Next, a second embodiment of the present invention is described. FIG. 5 is a diagram illustrating a configuration of a circuit device 1A according to the second embodiment. The circuit device 1A may be equal to the circuit device 1 illustrated in FIG. 3 except that the reset device 2 is replaced with a reset device 2A. The reset device 2A has the same configuration as the reset device 2 in FIG. 3, and includes a first diode D1 and a second diode D2.

The first diode D1 has an anode connected to the first power supply line Lp1 and a cathode connected to the second power supply line Lp2.

The second diode D2 has an anode connected to the signal line Ls and a cathode connected to the second power supply line Lp2.

According to the reset device 2A, when the difference in anode voltage between the first diode D1 and the second diode D2 is greater than the forward voltage Vf (approximately 0.6 V) of a diode element, one of the first diode D1 and the second diode D2 is turned on and the other is turned off. That is, when the voltage different between the first power supply line Lp1 and the signal line Ls is approximately 0.6 V or more, the diode (D1 or D2) connected to the line (Lp1 or Ls) of a higher voltage is turned on and the diode (D1 or D2) connected to the line (Lp1 or Ls) of a lower voltage is turned off. As a result, the supply voltage is supplied from the line (Lp1 or Ls) of a higher voltage to the POR circuit 4.

For example, when the voltage of the first power supply line Lp1 is higher than the voltage of the signal line Ls by approximately 0.6 V or more, the first diode D1 is turned on and the second diode D2 is turned off. Therefore, the supply voltage is suppled from the first power supply line Lp1 to the POR circuit 4.

When the voltage difference between the first power supply line Lp1 and the signal line Ls is approximately 0.6 V or less, the supply voltage is supplied from the first power supply line Lp1 or the signal line Ls to the POR circuit 4 by turning on the first switch 5 or the second switch 6. In this case, the diode (D1 or D2) connected in parallel to the switch (5 or 6) that is turned off is turned off.

For example, when the first switch 5 is turned on and the second switch 6 is turned off while the voltage difference between the first power supply line Lp1 and the signal line Ls is approximately 0.6 V or less, the supply voltage is supplied from the first power supply line Lp1 to the POR circuit 4. In this case, a voltage lower than the forward voltage Vf or a reverse voltage is applied to the second diode D2 connected in parallel to the second switch 6 that is turned off. Therefore, the second diode D2 is turned off.

According to the second embodiment, when the on-off state of the first switch 5 and the second switch 6 is switched in response to the switch control signal Sc of the control circuit 7, the supply voltage continues to be supplied to the POR circuit 4 via the first diode D1 or the second diode D2. This can prevent momentary interruption of the supply of the supply voltage to the POR circuit 4.

Furthermore, according to the second embodiment, when substantially the same voltage as applied to the first power supply line Lp1 to the signal line Ls in the test mode, the first diode D1 connected in parallel to the first switch 5 is turned off by turning off the first switch 5 and turning on the second switch 6. Therefore, it is possible to prevent supply current to the POR circuit 4 from flowing through the first power supply line Lp1 in the test mode.

Third Embodiment

Figure 6:
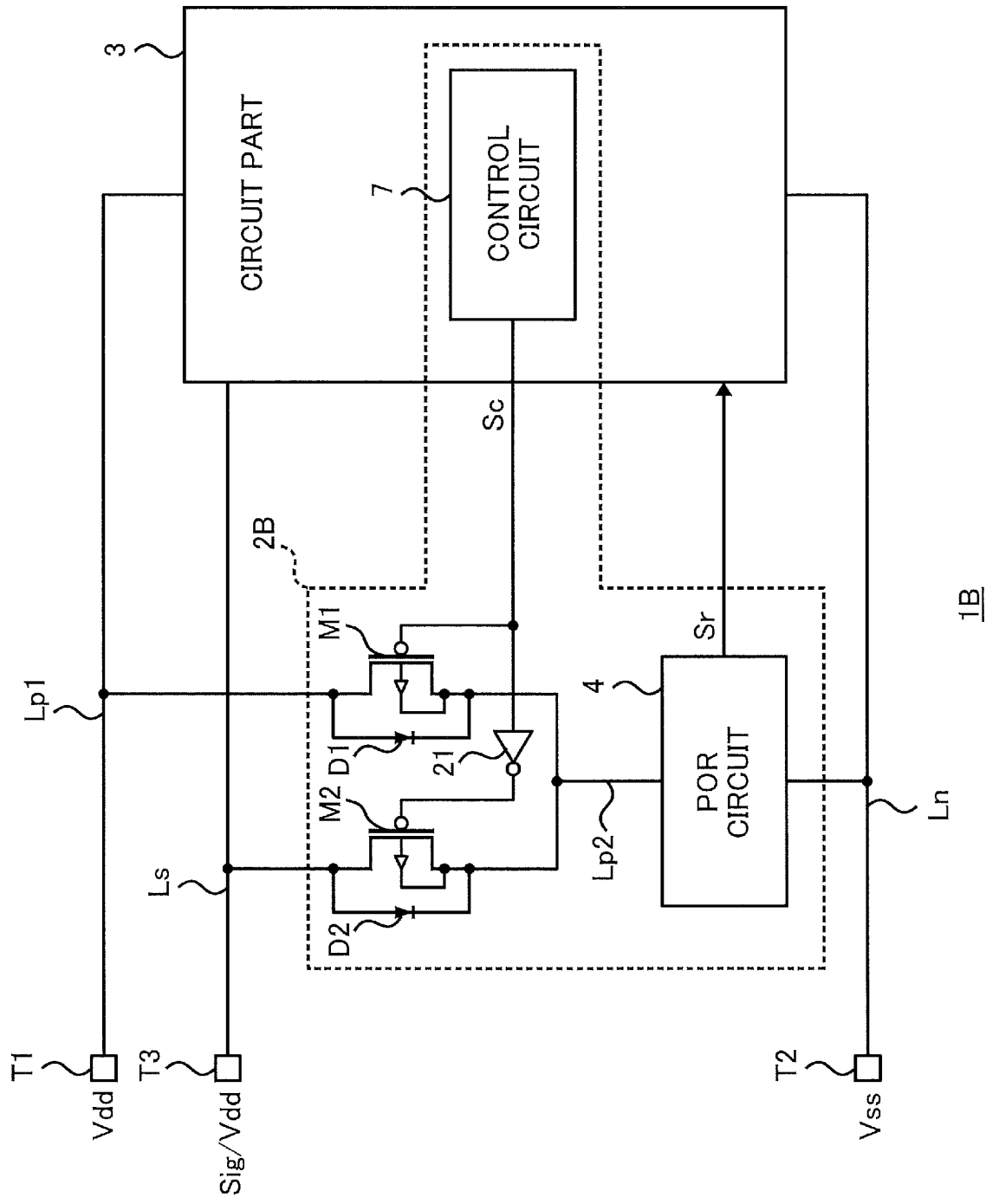
FIG. 6 is a diagram illustrating a configuration of a circuit device according to a third embodiment.

Next, a third embodiment of the present invention is described. FIG. 6 is a diagram illustrating a configuration of a circuit device 1B according to the third embodiment. The circuit device 1B may be equal to the circuit device 1A illustrated in FIG. 5 except that the reset device 2A is replaced with a reset device 2B. The reset device 2B may be equal to the reset device 2A except that the first switch 5 is replaced with a first transistor M1 and that the second switch 6 is replaced with a second transistor M2.

The first transistor M1 is provided in the path connecting the first power supply line Lp1 and the second power supply line Lp2, and turns on or off in response to the switch control signal Sc. The first diode D1 is the parasitic diode of the first transistor M1.

The second transistor M2 is provided in the path connecting the signal line Ls and the second power supply line Lp2, and turns on or off in response to the switch control signal Sc (inverted by the inverter circuit 21). The second diode D2 is the parasitic diode of the second transistor M2.

The first transistor M1 and the second transistor M2 are, for example, p-channel MOS transistors as illustrated in FIG. 6. The source of the first transistor M1 is connected to the first power supply line Lp1. The drain and the substrate potential of the first transistor M1 are connected to the second power supply line Lp2. The switch control signal Sc is input to the gate of the first transistor M1. The source of the second transistor M2 is connected to the signal line Ls. The drain and the substrate potential of the second transistor M2 are connected to the second power supply line Lp2. The output signal of the inverter circuit 21 is input to the gate of the second transistor M2.

According to the third embodiment, the first diode D1 and the second diode D2 are the parasitic diodes of the first transistor M1 and the second transistor M2, respectively. Therefore, compared with the case of using an independent diode element, it is possible to simplify configuration.

Fourth Embodiment

Figure 7:
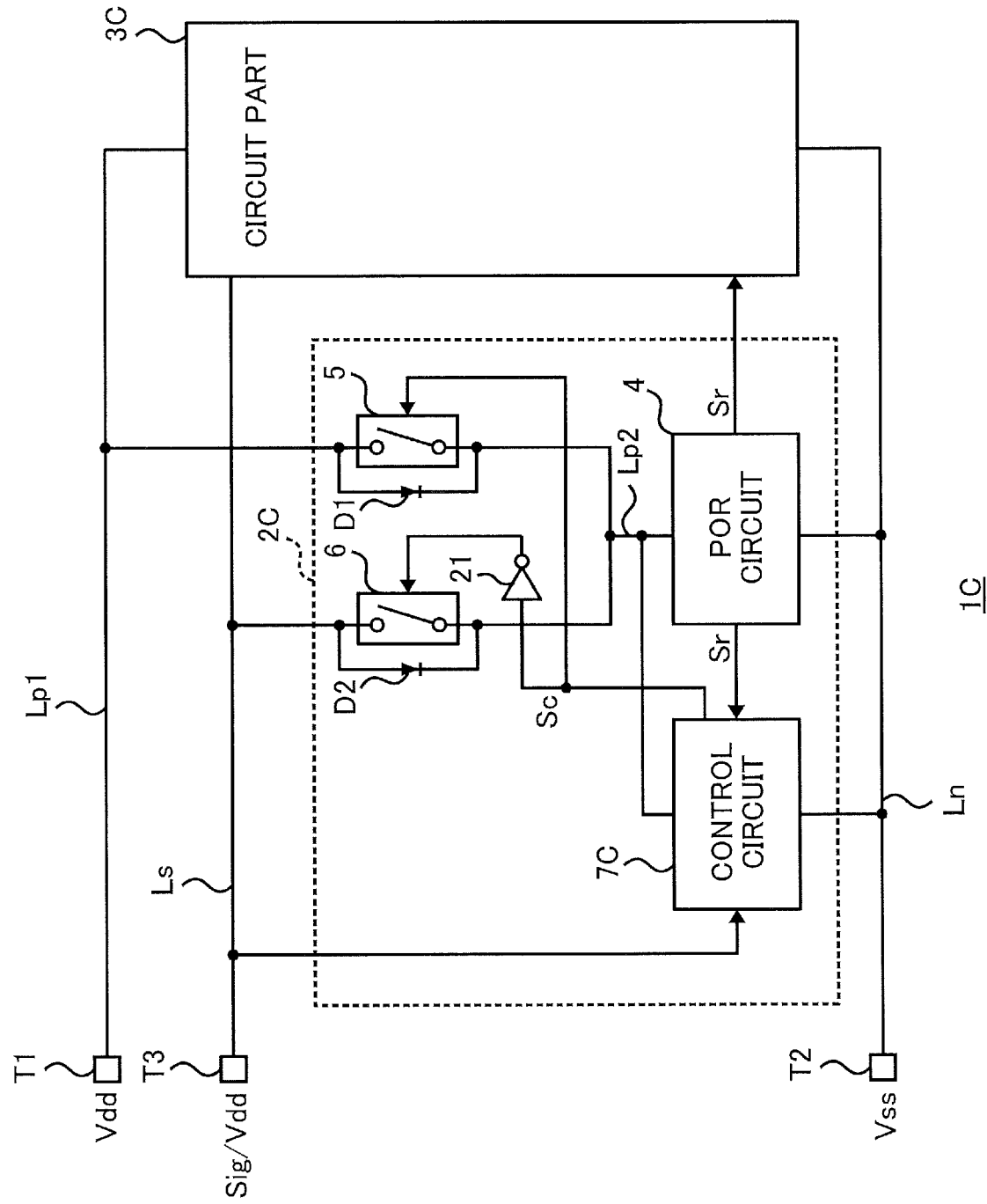
FIG. 7 is a diagram illustrating a configuration of a circuit device according to a fourth embodiment.

Next, a fourth embodiment of the present invention is described. FIG. 7 is a diagram illustrating a configuration of a circuit device 1C according to the fourth embodiment. The circuit device 1C may be equal to the circuit device 1A illustrated in FIG. 5 except that the circuit part 3 is replaced with a circuit part 3C and that the reset device 2A is replaced with a reset device 2C. The circuit part 3C may be equal to the circuit part 3 except that the control circuit 7 is removed. The reset device 2C may be equal to the reset device 2A except that the control circuit 7 is replaced with a control circuit 7C.

The control circuit 7C operates with the supply voltage supplied through the second power supply line Lp2, and is connected to the second power supply line Lp2 and the power supply line Ln as illustrated in FIG. 7. When the POR circuit 4 outputs the reset signal Sr, the control circuit 7C outputs the switch control signal Sc to turn on the first switch 5 and turn off the second switch 6, the same as the control circuit 7 described above. Furthermore, when a predetermined test mode start signal is input from the signal line Ls while the output of the reset signal Sr from the POR circuit 4 is stopped, the control circuit 7C outputs the switch control signal Sc to turn off the first switch 5 and turn on the second switch 6. The test mode start signal is, for example, a predetermined bit string, and is serially input bit by bit from the terminal T3.

According to the above-described reset device 2C, even when the switch control signal Sc of the control circuit 7C is undefined (when the on-off state of the first switch 5 and the second switch 6 is not determined) after the power is turned on, the supply voltage is supplied to the POR circuit 4 and the control circuit 7C from the first diode D1 via the second power supply line Lp2. Therefore, the voltage of the second power supply line Lp2 rises as the supply voltage of the first power supply line Lp1 rises, and reaches a voltage necessary for the operation of the POR circuit 4 and the control circuit 7C. When the supply voltage is lower than the threshold level Vth at the time of turning on power, the POR circuit 4 outputs the reset signal Sr. Therefore, when the voltage of the second power supply line Lp2 reaches a voltage necessary for the operation of the control circuit 7C, the control circuit 7C performs such control as to turn on the first switch 5 and turn off the second switch 6. As a result, the supply voltage is supplied to the POR circuit 4 and the control circuit 7C from the first power supply line Lp1.

As the supply voltage is supplied to the POR circuit 4, the POR circuit 4 stops outputting the reset signal Sr when the supply voltage exceeds the threshold level Vth.

When the test mode start signal is input from the signal line Ls while the output of the reset signal Sr from the POR circuit 4 is stopped, the control circuit 70 performs such control as to turn off the first switch 5 and turn on the second switch 6, so that the operating mode changes to the test mode. At this point, when substantially the same supply voltage as applied to the first power supply line Lp1 is applied to the signal line Ls, the first diode D1 is turned off. Therefore, supply current to the POR circuit 4 substantially flows through the signal line Ls, and does not flow through the first power supply line Lp1.

According to this embodiment, supply current to the control circuit 7C does not flow through the first power supply line Lp1 of the circuit part 3C in the test mode. Therefore, it is possible to accurately measure supply current to the circuit part 3C alone excluding that to the control circuit 7C.

Embodiments of the present invention are described in detail above. The present invention, however, is not limited to the specifically disclosed embodiments, and variations and modifications may be made without departing from the scope of the present invention.

For example, the POR circuits of the above-described embodiments may have a circuit configuration as desired, and may adopt any of various known circuit configurations.

Furthermore, the circuit part and the reset device may be formed on either a single semiconductor substrate or two or more semiconductor substrates.

Furthermore, the inverter circuit 21, which is included in the reset device (2, 2A, 2B, 2C) according to the examples illustrated in FIGS. 3 and 5 through 7, may be included in the circuit part (3, 3C).

According to an aspect of the present invention, a reset device configured to reset a circuit part to an initial state at the time of turning on power includes a power-on reset circuit configured to output a reset signal to reset the circuit part to the initial state when supply voltage is lower than a threshold level, and to stop outputting the reset signal in response to the supply voltage rising and exceeding the threshold level, a first switch provided in a path connecting a first power supply line to supply the supply voltage to the circuit part and a second power supply line to supply the supply voltage to the power-on reset circuit, a second switch provided in a path connecting a signal line to transmit a signal of the circuit part and the second power supply line, and a control circuit configured to turn on the first switch and turn off the second switch in a normal mode where the supply voltage is supplied from the first power supply line to the power-on reset circuit, and to turn off the first switch and turn on the second switch in a test mode where the supply voltage is supplied from the signal line to the power-on reset circuit. The control circuit is configured to turn on the first switch and turn off the second switch in response to the reset signal being output from the power-on reset circuit.

According to this configuration, when the supply voltage is lower than the threshold level at the time of turning on power, the POR circuit outputs the reset signal to reset the circuit part to the initial state. Furthermore, when the reset signal is output, the control circuit performs such control as to turn on the first switch and turn off the second switch. Accordingly, when the supply voltage rises from a voltage lower than the threshold level, the first switch turns on to supply the supply voltage of the first power supply line to the POR circuit via the first switch. When the supply voltage rises and exceeds the threshold level, the POR circuit supplied with the supply voltage stops outputting the reset signal. When the output of the reset signal is stopped, the circuit part can transition to a state other than the initial state.

After the output of the reset signal is stopped, in the case of the normal mode, the control circuit performs such control as to turn on the first switch and turn off the second switch. In this case, the supply voltage is supplied from the first power supply line to the POR circuit via the first switch. As a result, the output of the reset signal remains stopped in the POR circuit. Therefore, the circuit part can perform operation in the normal mode. Furthermore, in this case, the signal line is disconnected from the second power supply line. Therefore, a signal of the circuit part transmitted in the signal line is prevented from affecting the operation of the POR circuit. This allows a desired signal to be transmitted through the signal line.

A voltage higher than the threshold level may be applied to the signal line in the test mode.

After the output of the reset signal is stopped, in the case of the test mode, the control circuit performs such control as to turn off the first switch and turn on the second switch while a voltage higher than the threshold level is applied to the signal line. In this case, the second switch turns on to supply the voltage higher than the threshold level, applied to the signal line, to the POR circuit as supply voltage. As a result, the output of the reset signal remains stopped in the POR circuit. Therefore, the circuit part can perform operation in the test mode.

The reset device may include a first diode having an anode connected to the first power supply line and a cathode connected to the second power supply line and a second diode having an anode connected to the signal line and a cathode connected to the second power supply line.

According to this configuration, when the control circuit switches the on-off state of the first switch and the second switch, the supply voltage continues to be supplied to the POR circuit via the first diode or the second diode. Therefore, there is no momentary interruption of the supply of the supply voltage to the POR circuit.

The first switch may include a first transistor configured to make or break a connection between the first power supply line and the second power supply line, the second switch may include a second transistor configured to make or break a connection between the signal line and the second power supply line, the first diode may be a parasitic diode in the first transistor, and the second diode may be a parasitic diode in the second transistor.

The first transistor may be a p-channel MOS transistor having a source connected to the first power supply line, a drain connected to the second power supply line, and a substrate potential connected to the second power supply line, and the second transistor may be a p-channel MOS transistor having a source connected to the signal line, a drain connected to the second power supply line, and a substrate potential connected to the second power supply line.

According to this configuration, the first diode and the second diode are the parasitic diodes of the transistors. Therefore, compared with the case of using an independent diode element, it is possible to simplify configuration.

The control circuit may be configured to operate with the supply voltage supplied through the second power supply line.

According to this configuration, even when the circuit part does not include the control circuit, it is possible to control the first switch and the second switch.

The control circuit may be configured to turn off the first switch and turn on the second switch in response to a test mode start signal being input from the signal line while the output of the reset signal from the power-on reset circuit is stopped.

According to this configuration, even when the first switch is turned off, the supply voltage is supplied from the first power supply line to the control circuit via the first diode and the second power supply line. Therefore, the control circuit can control the first switch and the second switch when the test mode start signal is input to the control circuit from the signal line while the output of the reset signal from the POR circuit is stopped, the control circuit performs such control as to turn off the first switch and turn on the second switch.

The control circuit may be included in the circuit part.

According to this configuration, part of the circuit part can also be used for the control circuit.

According to another aspect of the present invention, a circuit device includes a circuit part and the above-described reset device configured to reset the circuit part to the initial state at the time of turning on power.

The circuit part and the reset device may be formed on a single semiconductor substrate.

According to yet another aspect of the present invention, a method of resetting a circuit part included in a circuit device to an initial state at a time of turning on power is provided The circuit device includes a power-on reset circuit, a first switch provided in a path connecting a first power supply line to supply a supply voltage to the circuit part and a second power supply line to supply the supply voltage to the power-on reset circuit, a second switch provided in a path connecting a signal line to transmit a signal of the circuit part and the second power supply line, and a control circuit. The method includes outputting, by the power-on reset circuit, a reset signal to reset the circuit part to the initial state when the supply voltage is lower than a threshold level, turning on the first switch and turning off the second switch, by the control circuit, in response to the reset signal being output from the power-on reset circuit, stopping, by the power-on reset circuit, outputting the reset signal in response to the supply voltage rising and exceeding the threshold level, turning on the first switch and turning off the second switch, by the control circuit, in a normal mode where the supply voltage is supplied from the first power supply line to the power-on reset circuit, applying a voltage higher than the threshold level to the signal line in a test mode where the supply voltage is supplied from the signal line to the power-on reset circuit, and turning off the first switch and turning on the second switch, by the control circuit, in the test mode.

According to an aspect of the present invention, it is possible to prevent supply current to a POR circuit from flowing through the power supply line of a circuit part without providing a dedicated terminal.

What is claimed is:

1. A reset device configured to reset a circuit part to an initial state at a time of turning on power, the reset device comprising:
  a power-on reset circuit configured to output a reset signal to reset the circuit part to the initial state when a supply voltage is lower than a threshold level, and to stop outputting the reset signal in response to the supply voltage rising and exceeding the threshold level;
  a first switch provided in a path connecting a first power supply line to supply the supply voltage to the circuit part and a second power supply line to supply the supply voltage to the power-on reset circuit;
  a second switch provided in a path connecting a signal line to transmit a signal of the circuit part and the second power supply line; and
  a control circuit configured to turn on the first switch and turn off the second switch in a normal mode where the supply voltage is supplied from the first power supply line to the power-on reset circuit, and to turn off the first switch and turn on the second switch in a test mode where the supply voltage is supplied from the signal line to the power-on reset circuit,
  wherein the control circuit is configured to turn on the first switch and turn off the second switch in response to the reset signal being output from the power-on reset circuit.

2. The reset device as claimed in claim 1, wherein a voltage higher than the threshold level is applied to the signal line in the test mode.

3. The reset device as claimed in claim 1, further comprising:
  a first diode having an anode connected to the first power supply line and a cathode connected to the second power supply line; and
  a second diode having an anode connected to the signal line and a cathode connected to the second power supply line.

4. The reset device as claimed in claim 3, wherein
  the first switch includes a first transistor configured to make or break a connection between the first power supply line and the second power supply line,
  the second switch includes a second transistor configured to make or break a connection between the signal line and the second power supply line,
  the first diode is a parasitic diode in the first transistor, and
  the second diode is a parasitic diode in the second transistor.

5. The reset device as claimed in claim 4, wherein
  the first transistor is a p-channel MOS transistor having a source connected to the first power supply line, a drain connected to the second power supply line, and a substrate potential connected to the second power supply line, and
  the second transistor is a p-channel MOS transistor having a source connected to the signal line, a drain connected to the second power supply line, and a substrate potential connected to the second power supply line.

6. The reset device as claimed in claim 3, wherein the control circuit is configured to operate with the supply voltage supplied through the second power supply line.

7. The reset device as claimed in claim 6, wherein the control circuit is configured to turn off the first switch and turn on the second switch in response to a test mode start signal being input from the signal line while an output of the reset signal from the power-on reset circuit is stopped.

8. The reset device as claimed in claim 1, wherein the control circuit is included in the circuit part.

9. The reset device as claimed in claim 1, wherein the circuit part and the reset device are formed on a single semiconductor substrate.

10. A method of resetting a circuit part included in a circuit device to an initial state at a time of turning on power, the circuit device including a power-on reset circuit, a first switch provided in a path connecting a first power supply line to supply a supply voltage to the circuit part and a second power supply line to supply the supply voltage to the power-on reset circuit, a second switch provided in a path connecting a signal line to transmit a signal of the circuit part and the second power supply line, and a control circuit, the method comprising:
  outputting, by the power-on reset circuit, a reset signal to reset the circuit part to the initial state when the supply voltage is lower than a threshold level;
  turning on the first switch and turning off the second switch, by the control circuit, in response to the reset signal being output from the power-on reset circuit;
  stopping, by the power-on reset circuit, outputting the reset signal in response to the supply voltage rising and exceeding the threshold level;

turning on the first switch and turning off the second switch, by the control circuit, in a normal mode where the supply voltage is supplied from the first power supply line to the power-on reset circuit;
applying a voltage higher than the threshold level to the signal line in a test mode where the supply voltage is supplied from the signal line to the power-on reset circuit; and
turning off the first switch and turning on the second switch, by the control circuit, in the test mode.

* * * * *